US011099220B2

(12) United States Patent
Hao

(10) Patent No.: US 11,099,220 B2
(45) Date of Patent: Aug. 24, 2021

(54) INTELLIGENT ELECTRONIC DEVICE CONTROL USING WIRELESSLY TRANSMITTED ELECTRICAL MEASUREMENTS

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 115 days.

(21) Appl. No.: 16/600,020

(22) Filed: Oct. 11, 2019

(65) Prior Publication Data

US 2021/0109135 A1 Apr. 15, 2021

(51) Int. Cl.
*G01R 19/25* (2006.01)
*G01R 19/155* (2006.01)
*G01R 19/15* (2006.01)
*G01R 21/133* (2006.01)

(52) U.S. Cl.
CPC ......... *G01R 19/2513* (2013.01); *G01R 19/15* (2013.01); *G01R 19/155* (2013.01); *G01R 21/133* (2013.01)

(58) Field of Classification Search
CPC .. G01R 19/25; G01R 19/2513; G01R 19/155; G01R 19/15; G01R 21/133; H04W 4/06
See application file for complete search history.

(56) References Cited

U.S. PATENT DOCUMENTS

| 2014/0324614 | A1* | 10/2014 | Kulkarni | H04W 4/12 705/26.1 |
| 2019/0331722 | A1* | 10/2019 | Hao | G01R 19/2513 |
| 2019/0386485 | A1* | 12/2019 | Hao | H02H 7/26 |

(Continued)

FOREIGN PATENT DOCUMENTS

| CN | 102791012 B | * | 1/2015 | H04W 40/24 |
| CN | 102752721 | * | 4/2015 | H04W 4/06 |
| CN | 104199427 B | * | 2/2017 | Y02P 90/02 |

OTHER PUBLICATIONS

Mohannad Jabbar Mnati, A Smart Voltage and Current Monitoring System for Three Phase Inverters Using an Android Smartphone Application, Sensors 2017,16 pages. (Year: 2017).*

(Continued)

*Primary Examiner* — Tung S Lau
(74) *Attorney, Agent, or Firm* — Fletcher Yoder, P.C.

(57) ABSTRACT

A system is provided for monitoring and protecting an electric power distribution system using intelligent electronic devices that may rely on the communication from wireless electrical measurement devices. A wireless electrical measurement device may obtain electrical measurements on a transmission line and wirelessly transmit messages containing the measurements to an intelligent electronic device. The intelligent electronic device may determine a consistency of wireless communication from the wireless electrical measurement device based at least in part on the received messages. When the wireless communication is determined to be presently consistent, the intelligent electronic device may operate in a first mode. When the wireless communication is determined not to be presently consistent, the intelligent electronic device may operate in a second mode.

24 Claims, 3 Drawing Sheets

(56) References Cited

U.S. PATENT DOCUMENTS

2020/0319240 A1* 10/2020 Hao .................... G01R 31/088
2021/0083478 A1* 3/2021 Hao .................... G01R 15/146
2021/0088555 A1* 3/2021 Hao ..................... G01R 15/18

OTHER PUBLICATIONS

Oleg Kachirski, Effective Intrusion Detection Using Multiple Sensors in Wireless Ad Hoc Networks, © 2002 IEEE, 8 pages (Year: 2002).*
Wenyuan Xu, The Feasibility of Launching and Detecting Jamming Attacks in Wireless Networks, Copyright 2005, 12 (Year: 2005).*
Kewei Sha, Modeling Data Consistency in Wireless Sensor Networks, printed Mar. 30, 2021, 6 pages (Year: 2021).*
Schweitzer Engineering Laboratories, Inc. "SEL-734B Compact Enclosure Capacitor Bank Controller", SEL AcSELerator Quickset Design Template Guide, Dec. 14, 2018.
Schweitzer Engineering Laboratories, Inc. "SEL-734B Full-Size Enclosure Capacitor Bank Controller", SEL Quickset® Design Template Guide, Dec. 14, 2018.

* cited by examiner

INTELLIGENT ELECTRONIC DEVICE CONTROL USING WIRELESSLY TRANSMITTED ELECTRICAL MEASUREMENTS

BACKGROUND

This disclosure relates to controlling an electric power distribution system. More particularly, this disclosure relates to operating intelligent electrical devices (IEDs) using wireless measurement devices, such as wireless current sensors (WCSs), within the electric power distribution system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power distribution systems carry electricity from a transmission system to residential communities, factories, industrial areas, and other electricity consumers. Current transformers may be used to reduce higher-voltage currents to lower values, enabling measurements of the electrical current flowing through transmission lines. Current transformers may provide these measurements to IEDs for applications such as protective relaying, electrical load surveying, verification of circuit energization, cost allocation, capacitor bank control, and demand alarming. Wireless current sensors are a particular type of current sensor that may obtain current measurements and wirelessly transmit the measurements to an intelligent electronic device (IED). Some wireless current sensors may operate using energy harvested from a transmission line, allowing them to operate without separate electrical wiring to a power source and/or without a battery or using a relatively smaller battery. Thus, unlike wired current sensors, which are powered by electrical wiring and tend to be located near an IED, wireless current sensors may offer greater flexibility. However, a loss of power on the transmission line or certain wireless interference conditions could cause a wireless current sensor to stop sending wireless signals. In that case, an IED may not receive current measurements from the wireless current sensor.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In one example, a system includes a wireless current sensor and an intelligent electronic device. The wireless current sensor may obtain electrical current measurements of an electrical waveform on a transmission line of an electric power distribution system and wirelessly transmit messages containing the measurements to an intelligent electronic device. The intelligent electronic device may receive the messages from the wireless current sensor and determine a consistency of wireless communication from the wireless current sensor based at least in part on the messages from the wireless current sensor. The intelligent electronic device may operate in a first mode in response to determining that the wireless communication from the wireless current sensor is presently consistent and operate in a second mode in response to determining that the communication from the wireless current sensor is not presently consistent.

In another example, tangible, non-transitory, computer-readable media may include instructions that, when executed by a processor, cause the processor to timestamp wireless messages indicating a time at which the messages are received by an intelligent electronic device that includes the processor. The wireless messages may include measurements of a power distribution system by a wireless electrical measurement device. The instructions may also cause the processor to compute an expected wireless message arrival interval based at least in part on the timestamps of the wireless messages. In response to determining that a time since a most recent message arrival is equal to or less than a threshold amount of time longer than the expected wireless message arrival interval, the instructions may cause the processor to cause a component of the power distribution system to be controlled using a first method. In response to determining that the time since the most recent message arrival is greater than the threshold amount of time longer than the expected wireless message arrival interval, the instructions may cause the processor to cause the component of the power distribution system to be controlled using a second method.

In another example, an intelligent electronic device may include processing circuitry, a communication system, and a memory device that holds processor-executable instructions. The instructions may cause the processing circuitry to receive wireless messages that include electrical current measurements from one or more wireless current sensors, store message arrival times of the wireless messages, and determine a present consistency of communication with the one or more wireless current sensors based at least in part on the message arrival times. When the communication is determined to be presently consistent, the instructions may cause the intelligent electronic device to implement a first mode of control of an electrical component on a power distribution system. When the communication is determined not to be presently consistent, the intelligent electronic device may implement a second mode of control of the electrical component on the power distribution system and cause a supervisory control and data acquisition (SCADA) system for the power distribution system to be notified of a loss of communication with the one or more wireless current sensors.

DETAILED DESCRIPTION

Figure 1:
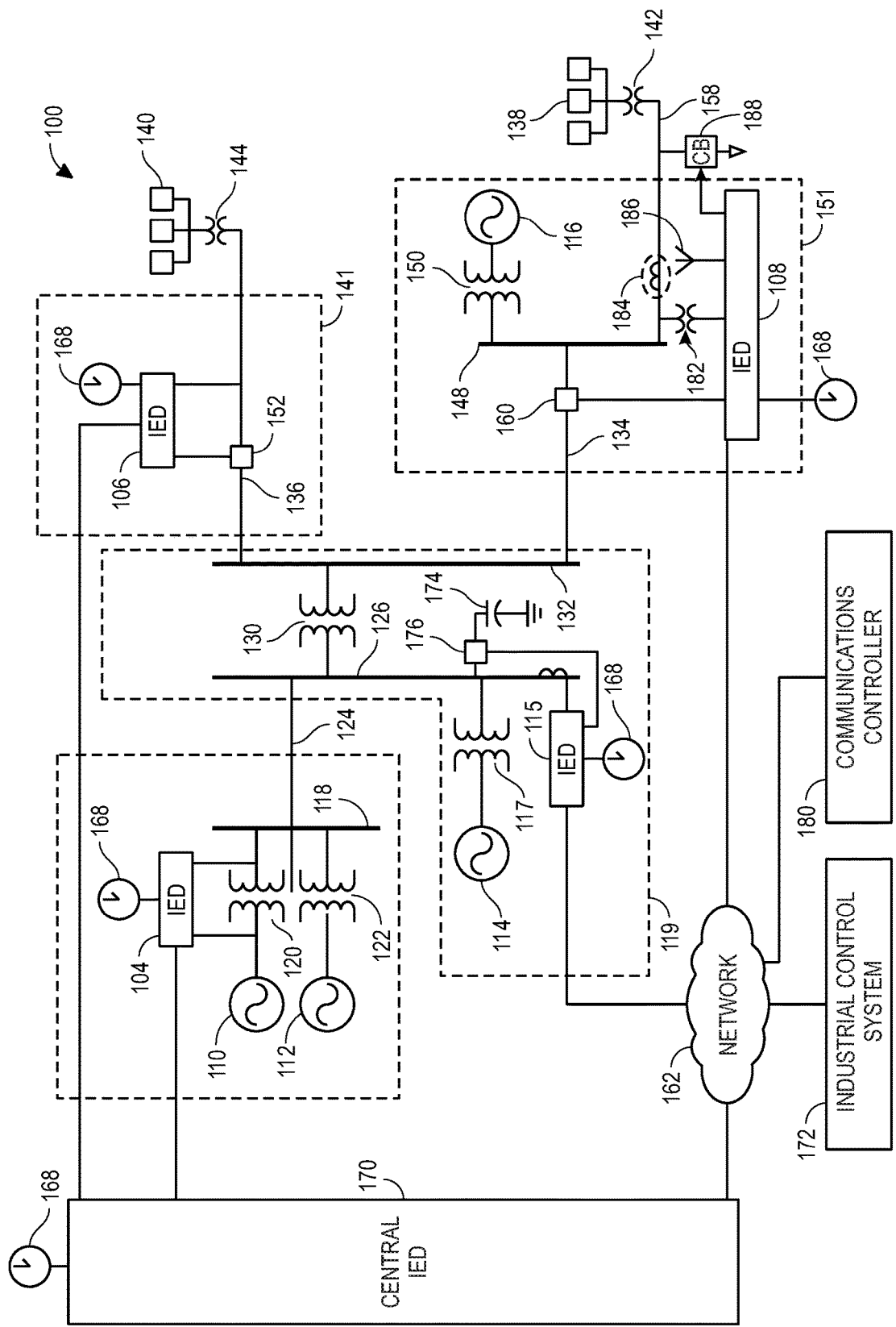
FIG. 1 is a simplified diagram of an electric power distribution system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Moreover, the embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

Intelligent electronic devices (IEDs) may be used to control certain devices on an electric power distribution system. In examples discussed below, an IED may be a capacitor bank controller that controls a capacitor bank on an electric power distribution system. However, it should be appreciated that the systems and methods of this disclosure may employ any suitable IED to control any suitable device to control an aspect of an electric power distribution system. Thus, where the disclosure below refers to a capacitor bank controller that uses the systems and methods of this disclosure, this should be understood to encompass any other suitable IEDs to control any other suitable devices for an electric power distribution system. Likewise, where the disclosure refers to wireless current sensors (WCSs) that may provide current measurements, this should be understood to encompass any other electrical measurement devices that wirelessly transmit electrical measurements in wireless messages.

As mentioned above, one type of electrical measurement device is a current sensor. A current sensor may be used to reduce higher-voltage currents to lower values, enabling measurements of the electrical current flowing through transmission lines. Current sensors may provide these measurements to IEDs for applications such as protective relaying, electrical load surveying, verification of circuit energization, cost allocation, capacitor bank control, and demand alarming. Some wireless current sensors may operate using energy harvested from a transmission line, allowing them to operate without separate electrical wiring to a power source and/or without a battery or using a relatively smaller battery. Thus, unlike wired current sensors, which are powered by electrical wiring and tend to be located near an IED, wireless current sensors may offer greater flexibility. However, a loss of power on the transmission line or certain wireless interference conditions could cause a wireless current sensor to stop sending wireless signals. In such an event of interrupted wireless communication, an IED may not receive current measurements from the wireless current sensor.

This disclosure describes systems and methods to identify and mitigate potential losses of wireless signals containing electrical measurements for use by an IED. Indeed, an IED may identify a pattern in the rate at which wireless messages are sent to the IED from a wireless electrical measurement device, such as a wireless current sensor (WCS). For example, the IED may identify an expected wireless message arrival time for a wireless message providing an electrical measurement. The expected wireless message arrival time may change as conditions in the power distribution system change. Indeed, in a case where the wireless electrical measurement device gleans power for transmitting the wireless messages from the power distribution system itself, the rate of wireless messages may depend on the present amount of power transmitted by the power distribution system. For example, the transmission rate of wireless messages may be higher when an electrical current transmitted by the electric power distribution system is higher, and the transmission rate of wireless messages may be lower when the electrical current transmitted by the electric power distribution system is lower. Thus, it may not be appropriate in some situations to assume that the expected wireless message arrival time will remain static; indeed, it may change as conditions in the power distribution system change. Accordingly, the IED may determine the expected wireless message arrival time dynamically. In one example, the expected wireless message arrival time may be an average (e.g., a weighted average) based on the arrival intervals of some number of recent wireless messages.

To identify whether wireless communication from the wireless electrical measurement device and the IED has paused or stopped (e.g., has been interrupted), the IED may start a timer when a new message arrives. The timer may be set to expire at some multiple of the expected wireless message arrival time (e.g., 2×). If the timer expires before the next message is received, this may indicate that communication with the wireless electrical measurement device is paused or has stopped (e.g., has been interrupted). This could mean that the previously received measurements from the wireless electrical measurement device may no longer represent the present electrical values on the electrical distribution system (for example, if the current was previously flowing on a distribution line and now has stopped). As such, the IED may determine to stop using the previously received electrical measurements or may determine to weight the previously received electrical measurements less in calculations it performs. Indeed, in some cases, the IED may operate according to a different operational mode (e.g., control method) depending on whether presently sufficiently recent communication with a wireless electrical measurement device is available. In one particular example, a capacitor bank controller may control a capacitor bank using a first control method based on both voltage and current while communication is consistent with a wireless current sensor providing present measurements of the current. When the communication with the wireless current sensor changes suddenly (e.g., suddenly slows, stops or pauses), however, the capacitor bank controller may control the capacitor bank using a second control method based on voltage instead of current.

FIG. 1 illustrates a simplified diagram of an electric power distribution system 100 that may use changes in wireless communication rates to determine whether to operate an IED using measurements from a wireless electrical measurement device. The electric power distribution system 100 may generate, transmit, and/or distribute electric energy to loads. As illustrated, the electric power distribution system 100 includes electric generators 110, 112, 114, and 116. The electric power distribution system 100 may also include power transformers 117, 120, 122, 130, 142, 144, and 150. Furthermore, the electric power delivery system may include lines 124, 134, 136, and 158 to transmit and/or deliver power, circuit breakers 152, 160, and 176 to control flow of power in the electric power distribution system 100, busses 118, 126, 132, and 148, and/or loads 138 and 140 to receive the power in and/or from the electric power distribution system 100. A variety of other types of equipment may also be included in electric power distribution system 100, such as current sensors (e.g., wireless current sensor (WCS) 184), potential transformers (e.g., potential transformer 182), voltage regulators, capacitors (e.g., capacitor 174) and/or capacitor banks (e.g., capacitor bank (CB) 188), antennas (e.g., antenna 186), and suitable other types of equipment useful in power generation, transmission, and/or distribution.

A substation 119 may include the electric generator 114, which may be a distributed generator, and which may be connected to the bus 126 through the power transformer 117 (e.g., step-up transformer). The bus 126 may be connected to a distribution bus 132 via the power transformer 130 (e.g., step-down transformer). Various distribution lines 136 and 134 may be connected to the distribution bus 132. The distribution line 136 may lead to a substation 141 where the distribution line 136 is monitored and/or controlled using an IED 106, which may selectively open and close circuit breaker 152. A load 140 may be fed from distribution line 136. The power transformer 144 (e.g., step-down transformer), in communication with the distribution bus 132 via distribution line 136, may be used to step down a voltage for consumption by the load 140.

A distribution line 134 may deliver electric power to a bus 148 of the substation 151. The bus 148 may also receive electric power from a distributed generator 116 via transformer 150. The distribution line 158 may deliver electric power from the bus 148 to a load 138, and may include the power transformer 142 (e.g., step-down transformer). A circuit breaker 160 may be used to selectively connect the bus 148 to the distribution line 134. The IED 108 may be used to monitor and/or control the circuit breaker 160 as well as the distribution line 158.

The electric power distribution system 100 may be monitored, controlled, automated, and/or protected using IEDs such as the IEDs 104, 106, 108, 115, and 170, and an industrial control system 172. In general, the IEDs in an electric power generation and transmission system may be used for protection, control, automation, and/or monitoring of equipment in the system. For example, the IEDs may be used to monitor equipment of many types, including electric transmission lines, electric distribution lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

As used herein, an IED (e.g., the IEDs 104, 106, 108, 115, and 170) may refer to any processing-based device that monitors, controls, automates, and/or protects monitored equipment within the electric power distribution system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system including multiple IEDs. Moreover, an IED of this disclosure may use a non-transitory computer-readable medium (e.g., memory) that may store instructions that, when executed by a processor of the IED, cause the processor to perform processes or methods disclosed herein. Moreover, the IED may include a wireless communication system to receive and/or transmit wireless messages from a wireless electrical measurement device. The wireless communication system of the IED may be able to communicate with a wireless communication system of the wireless electrical measurement devices, and may include any suitable communication circuitry for communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular).

A common time signal may be distributed throughout the electric power distribution system 100. Utilizing a common time source may ensure that IEDs have a synchronized time signal that can be used to generate time synchronized data, such as synchrophasors. In various embodiments, the IEDs 104, 106, 108, 115, and 170 may receive a common time signal 168. The time signal may be distributed in the electric power distribution system 100 using a communications network 162 and/or using a common time source, such as a Global Navigation Satellite System ("GNSS"), or the like.

According to various embodiments, the industrial control system 172 may include one or more of a variety of types of systems. For example, the industrial control system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a communications network 162. According to various embodiments, some IEDs may be in direct communication with other IEDs. For example, the IED 104 may be in direct communication with the central IED 170. Additionally or alternatively, some IEDs may be in communication via the communications network 162. For example, the IED 108 may be in communication with the central IED 170 via the communications network 162.

Communication via the communications network 162 may be facilitated by networking devices including, but not limited to, multiplexers, routers, hubs, gateways, firewalls, and/or switches. In some embodiments, the IEDs and the network devices may include physically distinct devices. In certain embodiments, the IEDs and/or the network devices may be composite devices that may be configured in a variety of ways to perform overlapping functions. The IEDs and the network devices may include multi-function hardware (e.g., processors, computer-readable storage media, communications interfaces, etc.) that may be utilized to perform a variety of tasks that pertain to network communications and/or to operation of equipment within the electric power distribution system 100.

A communications controller 180 may interface with equipment in the communications network 162 to create a software-defined network (SDN) that facilitates communication between the IEDs 170, 115, and, 108 and the industrial control system 172. In various embodiments, the communications controller 180 may interface with a control plane (not shown) in the communications network 162. Using the control plane, the communications controller 180 may direct the flow of data within the communications network 162.

The communications controller 180 may receive information from multiple devices in the communications network 162 regarding transmission of data. In embodiments in which the communications network 162 includes fiber optic communication links, the data collected by the communications controller 180 may include reflection characteristics, attenuation characteristics, signal-to-noise ratio characteristics, harmonic characteristics, packet loss statics, and the like. In embodiments in which the communications network 162 includes electrical communication links, the data collected by the communications controller 180 may include voltage measurements, signal-to-noise ratio characteristics, packet loss statics, and the like. In some embodiments, the communications network 162 may include both electrical and optical transmission media. The information collected by the communications controller 180 may be used to assess a likelihood of a failure, to generate information about precursors to a failure, and to identify a root cause of a failure. The communications controller 180 may associate information regarding a status of various communication devices and communication links to assess a likelihood of a failure. Such associations may be utilized to generate information about the precursors to a failure and/or to identify root cause(s) of a failure consistent with embodiments of the present disclosure.

Some IEDs, such as the IED 108, may receive wireless messages from a wireless electrical measurement device, such as the wireless current sensor (WCS) 184. A wireless electrical measurement device such as the wireless current sensor (WCS) 184 may include a processor and non-transitory computer-readable media that may store instructions that, when executed by the processor, cause the processor to obtain the electrical measurements and transmit them wirelessly to an IED, such as the IED 108. To that end, the wireless current sensor (WCS) 184 may include a current transformer, a metering circuit, and a communication system to wireless transmit measurements. The current transformer of the wireless current sensor (WCS) 184 may include a coil that may be looped around one phase of a distribution line (such as the distribution line 158). The electrical current measurement of distribution line 158 may be obtained by measuring the electrical current induced in the coil of the current transformer using the metering circuitry; the induced current is proportional to the current flowing through the measured phase of the distribution line 158. In this way, the wireless current sensor (WCS) 184 may measure an electrical current of an electrical waveform carried by the distribution line 158. For example, the wireless current sensor (WCS) 184 may measure a current magnitude and a zero crossing of an alternating current (AC) electrical waveform on the distribution line 158. In some cases, there may be as many wireless current sensors (WCSs) 184 as there are phases of electrical power on the distribution line 158.

The wireless current sensor (WCS) 184 may send the electrical measurements as wireless messages to the IED 108 via an antenna 186. The IED 108 may also use a time signal 168 to help the IED 108 assess arrival times of the wireless messages received by the IED 108 from the wireless current sensor (WCS) 184. The wireless messages may take any suitable form and may be transmitted using any suitable protocol. To conserve bandwidth, in some embodiments, the wireless messages may contain a representation of the current magnitude measurement and may be sent at a particular time based on a time of a zero crossing measurement. In one example, the wireless current sensor (WCS) 184 may transmit a wireless message immediately upon a zero crossing, so that the IED 108 may identify the zero crossing based on the arrival time of the wireless message. In another example, the wireless current sensor (WCS) 184 may transmit a wireless message just prior to a zero crossing, so that the arrival time of the wireless message at the IED 108—taking into account latencies of message transmission and receipt—is expected to represent the present zero crossing of the electrical current carried on the distribution line 158.

In some embodiments, the IED 108 may operate as a capacitor bank controller (CBC) that may control a capacitor bank (CB) 188. The capacitor bank (CB) 188 may represent an electrical component of the power distribution system 100 that contains capacitors that can be selectively switched to connect to the distribution line 158. Because the capacitors of the capacitor bank (CB) 188 introduce a reactive load to the distribution line 158 when connected to the distribution line 158, the IED 108 may control the switching of the capacitors of the capacitor bank (CB) 188 to control, for example, a power factor and/or phase shift on the distribution line 158. In addition to current measurements from the wireless current sensor (WCS) 184, the IED 108 may also receive voltage measurements from a potential transformer 182.

Figure 2:
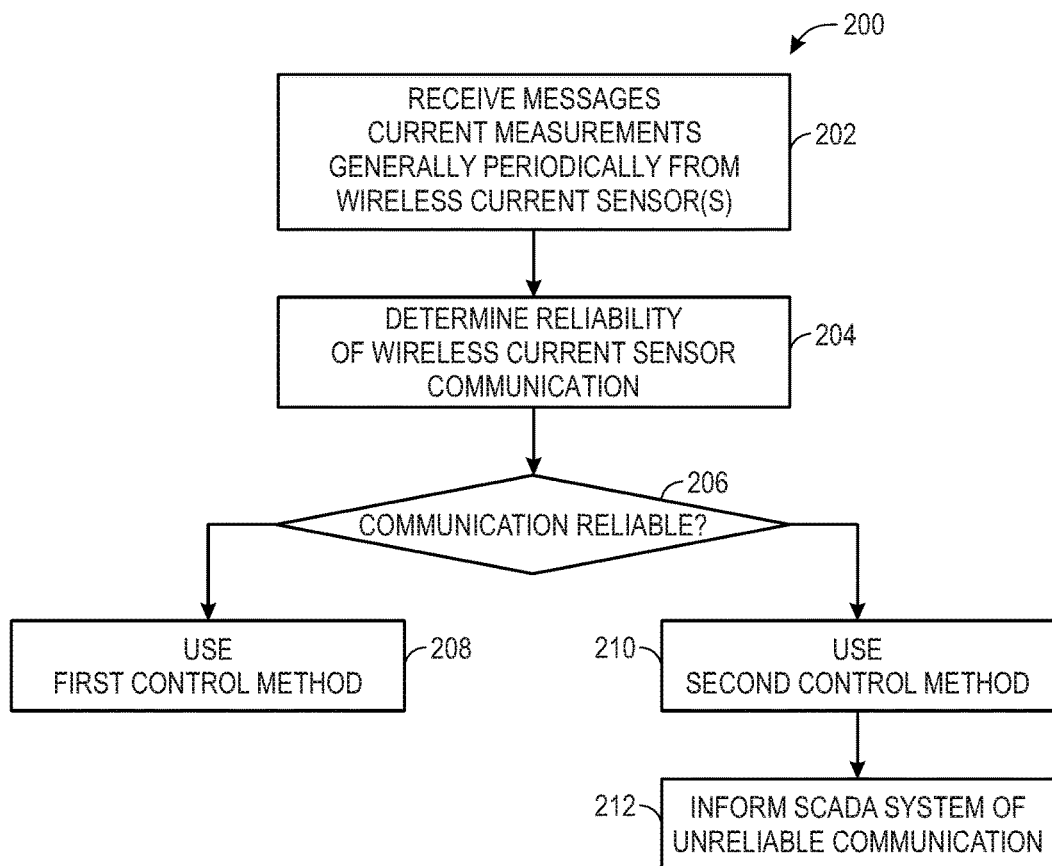
FIG. 2 is a block diagram of a wireless current sensor in communication with a capacitor bank controller of the electric power distribution system, in accordance with an embodiment.

As noted above, there may be as many wireless current sensors (WCSs) 184 as there are phases of electrical power on the distribution line 158. For example, as shown by a three-phase arrangement 190 in FIG. 2, there may be three wireless current sensors (WCSs) 184A, 184B, and 184C that measure electrical current on three respective phases A, B, and C carried by different conductors of the distribution line 158 (158A, 158B, and 158C). There may also be three corresponding potential transformers 182A, 182B, and 182C to obtain voltage measurements for the three respective phases A, B, and C. In FIG. 2, the IED 108 is shown to represent a capacitor bank controller (CBC) 192 that may receive wireless messages from the wireless current sensors (s) 184A, 184B, and 184C via its antenna 186. Thereafter, the IED 108 (capacitor bank controller (CBC) 192) may use any suitable control method to issue control signals 194 to control the capacitor bank (CB) 188. Some control methods may take into account both the voltage measurements from the potential transformers 182 and the current measurements from the wireless current sensors (WCSs) 184 to control a power factor or phase shift on the distribution lines 158A, 158B, and 158C, while other control methods may be static (e.g., based on a programmed schedule associated with the date and/or time of day) or may use voltage measurements but not current measurements.

Different IED modes or operation (e.g., control methods) may be more or less effective under different circumstances. In general, a control method that uses both voltage and current measurements may be more effective than a control method that uses only voltage measurements or that is static. This may not be the case, however, if the current or voltage measurements no longer represent the present conditions on the electric power distribution system. Thus, an IED receiving wireless measurements from a wireless electrical measurement device may select a particular control method depending at least in part on the consistency of the rate of the wireless messages.

Figure 3:
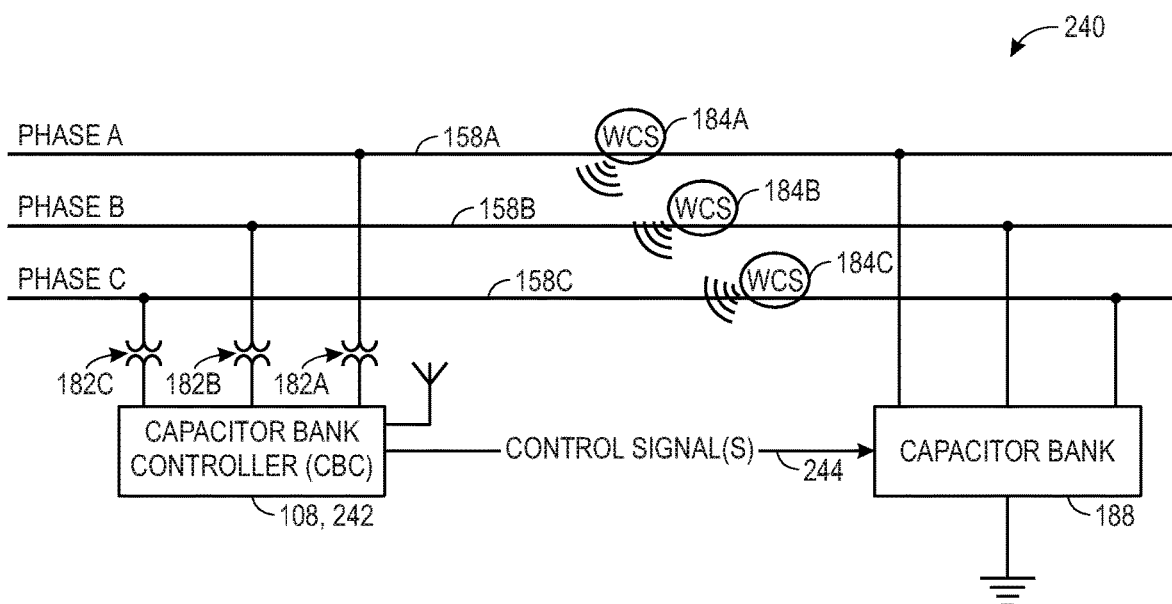
FIG. 3 is a flowchart of a process used to determine an operation mode for operating an IED based on communication sent from a wireless electrical measurement device such as a wireless current sensor, in accordance with an embodiment.

FIG. 3 is a flow chart of a process 200 by which a particular control method may be selected using a consistency of a rate of wireless communication messages from the wireless current sensor (WCS) 184 to the IED 108. The process 200 begins as the IED 108 receives wireless messages indicating electrical current measurements from the wireless current sensor (WCS) 184 (block 202). The wireless messages may be received generally periodically if the wireless connection between the wireless current sensor (WCS) 184 and the IED 108 is uninterrupted and electrical current is flowing on the distribution line 158 (if the wireless current sensor (WCS) 184 is harvesting energy from the electrical current on the distribution line 158 to be able to operate). However, the rate of wireless communication may vary depending on the amount of current on the distribution line 158. For example, a higher current (e.g., about 40 Amperes) may provide enough energy for the wireless current sensor (WCS) 184 to obtain electrical current measurements and send a wireless message about once every second. By contrast, a lower current (e.g., about 3 Amperes to 5 Amperes) may provide sufficient energy for the wireless current sensor (WCS) 184 to obtain electrical current measurements and send a wireless message about once every 75 seconds. In other words, the consistency of the wireless communication may be a better indicator of whether there has been an interruption in the wireless communication than the absolute rate.

As the wireless messages are received by the IED, the consistency of the wireless messages may be determined (block 204). Various examples how this may be done will be discussed in greater detail below with reference to FIG. 4. Continuing to review FIG. 3, if the wireless communication rate is consistent (e.g., has not changed more than some threshold, has not paused or stopped) (decision block 206), a first operational mode (e.g., first control method, first reliance on electrical measurements from the wireless electrical measurement device) for operating the IED 108 may be implemented (block 208). For example, the first mode may involve using a control method based on measurements of both electrical current and voltage. If the wireless communication rate has changed more than the threshold (decision block 206), however, a second operational mode (e.g., second control method, lower or no reliance on electrical measurements from the wireless electrical measurement device) for operating the IED 108 may be implemented (block 210). This is despite that the second operational mode may be suboptimal or less precise than the first. The second control method may involve operating the IED 108 without using the electrical current measurements from the wireless current sensor (WCS) 184. For example, the second control method may be a voltage-based control method that does not use current measurements or that weights current measurements less, or which is static (e.g., operating according to a defined schedule). The IED 108 may also inform other systems on the power distribution system, such as a SCADA system, that there has been a loss of communication with the wireless current sensor (WCS) 184 or that the communication has changed (e.g., indicating that the previous measurements of the wireless current sensor (WCS) 184 may no longer be presently valid) (block 212).

Using the example of the IED 108 as the capacitor bank controller (CBC) 192, the first control method may involve a control method that uses electrical current measurements. These may include, for example, a voltage-ampere-reactive (VAR) control method, a power factor control method, or a current control method, or some combination of these. A VAR control method may be carried out by determining the amount of reactive power present in a circuit, in which the reactive power is directly proportional to the electrical current and voltage, Using the VAR control method, the IED 108 may control the capacitor bank (CB) 188 to achieve a desired level of VARs on the distribution line 158. Similarly, a power factor control method may depend on the electrical current and voltage measurements. Power factor is the ratio between active power (due to resistive loads) and apparent power (combination of reactive power due to reactive loads and active power due to resistive loads). Using the power factor control method, the IED 108 may control the capacitor bank (CB) 188 to achieve a desired power factor on the distribution line 158. Meanwhile, using a current control method, the IED 108 may control the capacitor bank (CB) 188 to control a behavior of the current on the distribution line 158.

Continuing with the example of the IED 108 as the capacitor bank controller (CBC) 192, the second control method may involve a control method that does not use electrical current measurements or that weights electrical current measurements less than the first control method. Despite being suboptimal or less precise than the first method, the second control method may be preferred when the electrical current measurements from the wireless current sensor (WCS) 184 are unavailable or may no longer be valid for the present state of the distribution line 158 (e.g., when the rate of wireless messages changes dramatically). For example, the second control method may be a voltage-only control method that involves controlling the capacitor bank (CB) 188 to control a behavior of the voltage on the distribution line 158. Additionally or alternatively, the second control method may involve a static control method where the IED 108 controls the capacitor bank (CB) 188 according to a defined schedule (e.g., day vs. night). It should be appreciated that any suitable control methods may be used as the first control method or the second control method and that these control methods have been provided above by way of example. Indeed, the control methods discussed herein are meant to be illustrative and not exhaustive examples of the types of control methods that may be used.

Figure 4:
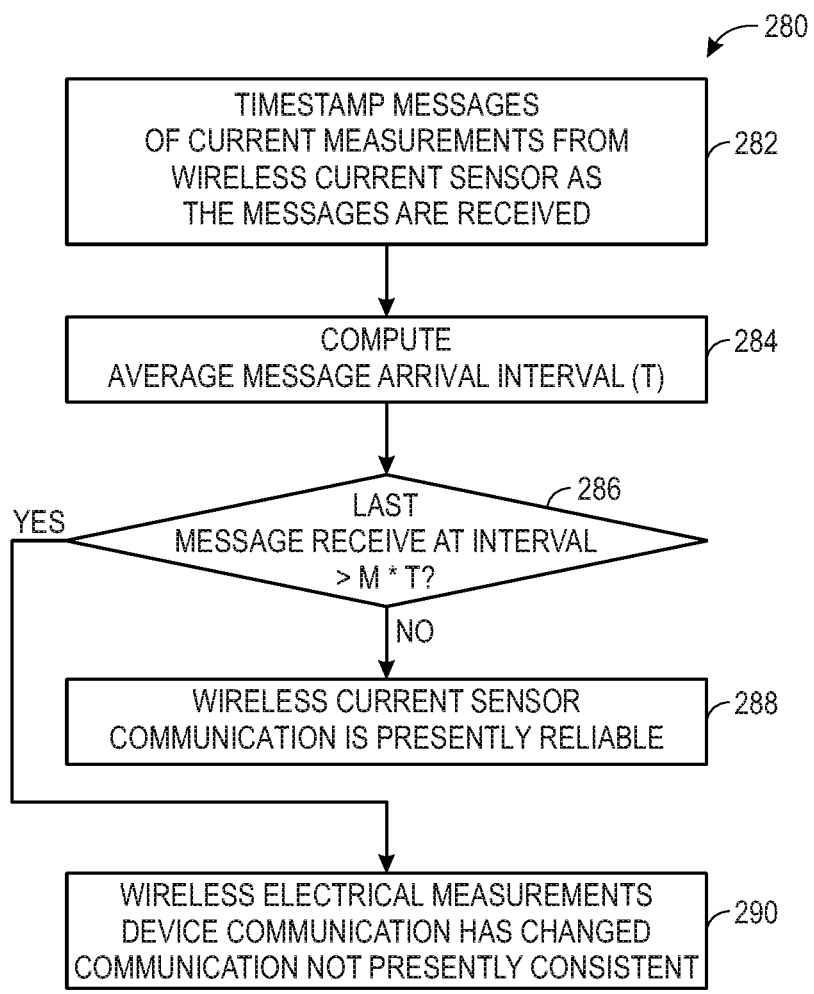
FIG. 4 is a flowchart of a process used to determine whether communication with a wireless electrical measurement device has suddenly changed, in accordance with an embodiment.

FIG. 4. is a flow chart of a process 280 to determine the consistency of wireless communication from a wireless electrical measurement device, such as a wireless current sensor (WCS) 184. Based on the consistency of the wireless communication, an IED, such as the IED 108, may determine whether to operate using a particular control method (e.g., a first control method or a second control method, as discussed above with reference to FIG. 3) or to determine whether to consider valid the electrical measurements received from the wireless electrical measurement device.

Considering the wireless current sensor (WCS) 184 by way of example, the wireless current sensor (WCS) 184 may obtain electrical current measurements at a faster rate when the current supplied on its respective distribution line is higher since it will harvest more energy with higher currents. On the other hand, the wireless current sensor (WCS) 184 may obtain electrical current measurements at a slower rate when the current supplied on its respective distribution line is lower. As such, the rate at which wireless messages are transmitted by the wireless current sensor (WCS) 184 to the IED 108 may change as conditions on the electrical distribution line 158 change. Thus, the interval between wireless messages may not be static.

To identify whether the wireless communication from a wireless electrical measurement device is consistent, an expected message arrival interval first may be determined. As electrical measurements are acquired, the wireless electrical measurement device may send a wireless message to the IED The IED may timestamp the wireless messages as they are received (block 282). Additionally or alternatively, the wireless messages themselves may contain a timestamp from the wireless electrical measurement device. Some number of recent timestamps may be stored (e.g., the number N referred to below).

To compute an expected wireless message arrival time (T) (block 284), the IED may compute an average (e.g., a weighted average) wireless message arrival time based on the arrival intervals of some number of recent wireless messages. In one example, the expected wireless message arrival interval T may be computed as follows:

$$T = \frac{T_i - T_{i-N}}{N} \qquad \text{Eq. 1}$$

where $T_i$ represents a most recent arrival time and $T_{i-N}$ represents an arrival time N messages in the past. Any suitable number N of wireless messages may be used in computing the average arrival interval (e.g., 2, 3, 5, 10, 15, 20, 30, 50, 100, 150, 200, 300, 500, 1000, or higher). In some cases, the number N may be selected to be static. In some cases, the number N may be selected to vary depending on the previous value of the expected wireless message arrival interval (T). For example, when previous values of the expected wireless message arrival interval (T) have been shorter (e.g., the current on the distribution line 158 is higher, causing the wireless current sensor (WCS) 184 to harvest more energy and take more measurements), the number N may be selected to be higher. When previous values of the expected wireless message arrival interval (T) have been longer (e.g., the current on the distribution line 158 is lower, causing the wireless current sensor (WCS) 184 to harvest less energy and take fewer measurements), the number N may be selected to be lower.

In another example, the expected wireless message arrival interval T may be computed as follows:

$$T = \Sigma_{i=x-N}^{x}(T_i - T_{i-1})^*W_i \qquad \text{Eq. 2}$$

where $T_i$ represents an arrival time for a message i, $T_{i-1}$ represents an arrival time for a message just prior to the message i, N represents the number of messages in the past over which to perform the calculation starting with a current message x, and $W_i$ represents a weighting coefficient between 0 and 1 that, over x-N to x sums to a desired value (e.g., 1). The weighting coefficient may be selected for equal weight for all N messages or may be selected to be different. For example, the weighting coefficient may be higher for more recent messages and lower for older messages (or vice versa) to more heavily weight more recent messages. Any other suitable computation may be used to determine the expected message arrival interval.

Having obtained the expected message arrival interval (T), the IED may start a timer when a new message arrives. The timer may be set to some proportion M (e.g., multiple)

of the expected wireless message arrival time (e.g., M*T). The proportion M may be any suitable value (e.g., 1.1, 1.2, 1.5, 2, 5, 10, 20, 50, 100, or higher). In some cases, the proportion M may be adaptive to the expected message arrival interval. For instance, the proportion M may be set to be higher when the expected message arrival interval is shorter. Conversely, the proportion M may be set to be lower when the expected message arrival interval is longer. If the next wireless message arrives before the timer expires (decision block 286), the IED may determine that the wireless communication is presently consistent (block 288) and the electrical measurements in the wireless messages can be relied upon as representing present electrical conditions of the power distribution system. If the timer ends before the next message is received (decision block 286), however, this may indicate that communication with the wireless electrical measurement device is paused or has stopped (e.g., has been interrupted) and may not be presently consistent (block 290). Under these conditions, as indicated by the process shown in FIG. 3, the IED may avoid using the electrical measurements from the wireless electrical measurement device and/or may generate an "loss of communication" alarm. By contrast, if a wireless message is received before the timer ends, wireless communication may be deemed to be consistent and the electrical measurements from the wireless electrical measurement device may considered as validly representing the present conditions on the distribution line.

In the event that the wireless communication is determined not to be presently consistent (block 290), some number of subsequent wireless messages may be received before the wireless communication may be considered consistent again. For example, the number N messages (e.g., 2, 3, 5, 10, 15, 20, 30, 50, 100, 150, 200, 300, 500, 1000, or higher) may be received consecutively (e.g., within some threshold of the latest arrival interval) before the wireless communication may be considered consistent again. Indeed, if only sporadic messages are received (e.g., not within some threshold of the latest arrival interval), the IED may not use the electrical measurements received in those messages. Additionally or alternatively, the IED may generate an "unreliable communication" alarm to notify the SCADA system.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system comprising:
    a wireless current sensor configured to:
        obtain electrical current measurements of an electrical waveform on a transmission line of an electric power distribution system; and
        wirelessly transmit messages containing the measurements to an intelligent electronic device; and
    the intelligent electronic device, wherein the intelligent electronic device is configured to:
        receive the messages from the wireless current sensor;
        determine a consistency of wireless communication from the wireless current sensor based at least in part on an average message arrival interval of the messages received from the wireless current sensor, wherein the wireless communication is determined to be consistent when a most recent message arrival time occurred more recently than an amount of time longer than the average message arrival interval, and wherein the wireless communication is determined not to be consistent when the most recent message arrival time occurred longer ago than the amount of time longer than the average message arrival interval;
        operate in a first mode in response to determining that the wireless communication from the wireless current sensor is presently consistent; and
        operate in a second mode in response to determining that the wireless communication from the wireless current sensor is not presently consistent.

2. The system of claim 1, wherein the intelligent electronic device is configured to determine the consistency of the wireless communication from the wireless current sensor at least in part by:
    computing the average message arrival interval based at least in part on at least a subset of message arrival times of the messages received from the wireless current sensor;
    starting a timer beginning at the most recent message arrival time, wherein the timer has an expiration time corresponding to the amount of time longer than the average message arrival interval; and
    when the timer has expired, determine that the wireless communication from the wireless current sensor is not presently consistent.

3. The system of claim 2, wherein the average message arrival interval is computed as a weighted average.

4. The system of claim 1, wherein the wireless current sensor is configured to obtain the electrical current measurements at a faster rate when a magnitude of a current is higher and obtain the electrical current measurements at a slower rate when the magnitude of the current is lower.

5. The system of claim 4, wherein the wireless current sensor is configured to transmit one of the messages each time one of the electrical current measurements is obtained.

6. The system of claim 1, wherein the first mode comprises controlling an aspect of the electric power distribution system using the electrical current measurements and wherein the second mode comprises controlling the aspect of the electric power distribution system with less or no usage of the electrical current measurements.

7. The system of claim 1, wherein the system comprises a capacitor bank and wherein the intelligent electronic device comprises a capacitor bank controller, wherein the capacitor bank controller is configured to control the capacitor bank at least in part using the electrical current measurements when operating in the first mode and wherein the capacitor bank controller is configured to control the capacitor bank with less or no usage of the electrical current measurements when operating in the second mode.

8. The system of claim 1, comprising one or more potential transformers used to acquire voltage measurements, wherein the first mode comprises a mode that uses only the electrical current measurements or both the electrical current measurements and the voltage measurements, and wherein the second mode comprises a mode that uses the voltage measurements but not the electrical current measurements.

9. One or more non-transitory, computer-readable media comprising instructions that, when executed by a processor, cause the processor to:
  timestamp wireless messages indicating a time at which the wireless messages are received by an intelligent electronic device that comprises the processor, wherein the wireless messages comprise measurements of a power distribution system by a wireless electrical measurement device;
  compute an expected wireless message arrival interval based at least in part on the timestamps of the wireless messages, wherein the expected wireless message arrival time is based at least in part on an average message arrival time;
  in response to determining that a time since a most recent message arrival is equal to or less than a threshold amount of time longer than the expected wireless arrival interval, cause a component of the power distribution system to be controlled using a first method; and
  in response to determining that the time since the most recent message arrival is greater than the threshold amount of time longer than the expected wireless arrival interval, cause a component the power distribution system to be controlled using a second method.

10. The one or more non-transitory, computer-readable media of claim 9, wherein the intelligent electrical device comprises a capacitor bank controller, and wherein causing the component of the power distribution system to be controlled comprises controlling a capacitor bank of the power distribution system.

11. The one or more non-transitory, computer-readable media of claim 9, wherein the wireless electrical measurement device comprises a wireless current sensor.

12. The one or more non-transitory, computer-readable media of claim 9, wherein the wireless messages have arrival intervals vary at least in part on a variable amount of energy harvesting by the wireless electrical measurement device that depends at least in part on a present magnitude of electrical current supplied on the power distribution system.

13. The one or more non-transitory, computer-readable media of claim 9, wherein the first method controls the component of the power distribution system based at least in part on the measurements by the wireless electrical measurement device.

14. The one or more non-transitory, computer-readable media of claim 13, wherein the measurements by the wireless electrical measurement device comprise measurements of electrical current on the power distribution system, and wherein the first method employs a control scheme that uses the measurements of electrical current and measurements of voltage on the power distribution system that are obtained by a different electrical measurement device.

15. The one or more non-transitory, computer-readable media of claim 9, wherein the second method controls the component of the power distribution system without using the measurements by the wireless electrical measurement device.

16. The one or more non-transitory, computer-readable media of claim 9, wherein the measurements by the wireless electrical measurement device comprise measurements of electrical current on the power distribution system, and wherein the second method employs a control scheme that uses measurements of voltage on the power distribution system that are obtained by a different electrical measurement device.

17. An intelligent electronic device comprising:
  processing circuitry;
  a communication system; and
  a memory device comprising instructions that cause the processing circuitry to:
    receive wireless messages comprising electrical current measurements from one or more wireless current sensors;
    store message arrival times of the wireless messages;
    determine a present consistency of communication with the one or more wireless current sensors based at least in part on an average message arrival interval computed from the message arrival times, wherein the communication is determined to be consistent when a most recent message arrival time occurred more recently than an amount of time longer than the average message arrival interval, and wherein the communication is determined not to be consistent when the most recent message arrival time occurred longer ago than the amount of time longer than the average message arrival interval;
    when the communication is determined to be presently consistent, implement a first mode of control of an electrical component on a power distribution system;
    when the communication is determined not to be presently consistent, implement a second mode of control of the electrical component on the power distribution system and cause a supervisory control and data acquisition (SCADA) system for the power distribution system to be notified of a loss of communication with the one or more wireless current sensors.

18. The intelligent electrical device of claim 17, wherein the instructions to determine the consistency of the communication with the one or more wireless current sensors comprise instructions to:
  compute an expected message arrival interval based at least in part on the average message arrival time based at least in part on at least a subset of stored message arrival times;
  start a timer beginning at a most recent message arrival time, wherein the timer has an expiration time that is a multiple of the expected message arrival interval that corresponds to the amount of time longer than the average message arrival interval;

while the timer has not expired, determine that the communication is presently consistent; and when the timer has expired, determine that the communication is not presently consistent.

19. The intelligent electrical device of claim 18, wherein the instructions to compute the expected message arrival interval comprise instructions to compute an average.

20. The intelligent electrical device of claim 18, wherein the instructions to compute the expected message arrival interval comprise instructions to compute a weighted average that more heavily weights more recent messages.

21. The intelligent electrical device of claim 18, wherein the subset of stored message arrival times comprises at least 10 most recent message arrival times.

22. The intelligent electrical device of claim 18, wherein the multiple is at least two.

23. The intelligent electrical device of claim 18, wherein the multiple is adaptive to the expected message arrival interval.

24. The intelligent electrical device of claim 23, wherein the multiple is selected to be higher when the expected message arrival interval is shorter and wherein the multiple is selected to be lower when the expected message arrival interval is longer.

* * * * *